(12) United States Patent
Hsieh et al.

(10) Patent No.: US 8,182,302 B2
(45) Date of Patent: May 22, 2012

(54) FABRICATION METHOD FOR ORGANIC ELECTROLUMINESCENT DISPLAY WITH REFLECTION-REDUCING PROPERTIES

(75) Inventors: Chia-Fen Hsieh, Tainan (TW); Tze-Chien Tsai, Taipei County (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 12/620,692

(22) Filed: Nov. 18, 2009

(65) Prior Publication Data

US 2010/0059364 A1    Mar. 11, 2010

Related U.S. Application Data

(62) Division of application No. 11/202,973, filed on Aug. 12, 2005, now Pat. No. 7,642,709.

(30) Foreign Application Priority Data

Apr. 25, 2005   (TW) ................................. 94113072 A

(51) Int. Cl.
    *H01J 9/24* (2006.01)
(52) U.S. Cl. .......................................... 445/24; 313/504

(58) Field of Classification Search ............ 445/24–25; 313/504
    See application file for complete search history.

(56) References Cited

U.S. PATENT DOCUMENTS

| | | | | |
|---|---|---|---|---|
| 5,064,477 A | * | 11/1991 | Delahoy | 136/256 |
| 5,705,256 A | * | 1/1998 | Takahashi | 428/195.1 |
| 6,146,805 A | * | 11/2000 | Yoshimura et al. | 430/125.5 |
| 6,429,451 B1 | | 8/2002 | Hung et al. | |
| 6,560,398 B1 | * | 5/2003 | Roach et al. | 385/147 |
| 2002/0176992 A1 | | 11/2002 | Parthasarathy et al. | |
| 2004/0222414 A1 | * | 11/2004 | Ito et al. | 257/40 |

FOREIGN PATENT DOCUMENTS

CN    1518132    8/2004

* cited by examiner

*Primary Examiner* — Toan Ton
*Assistant Examiner* — Hana Featherly
(74) *Attorney, Agent, or Firm* — Thomas|Kayden

(57) ABSTRACT

An organic electroluminescent device and method for fabricating the same are provided. The organic electroluminescent device comprises an anode. An organic luminescent layer is formed over the anode. A partially light-transmitting layer is formed over the organic luminescent layer. A protection layer is formed over the partially light-transmitting layer. A reflection-reducing layer is formed over the protection layer. A cathode is formed over the reflection-reducing layer.

10 Claims, 3 Drawing Sheets

FABRICATION METHOD FOR ORGANIC ELECTROLUMINESCENT DISPLAY WITH REFLECTION-REDUCING PROPERTIES

CROSS-REFERENCE TO RELATED APPLICATION

This application is a division of U.S. patent application Ser. No. 11/202,973, filed Aug. 12, 2005, now U.S. Pat. No. 7,642,709, and entitled "Organic Electroluminescent Display With Reflection-Reducing Properties," which is incorporated herein by reference.

BACKGROUND

The present invention relates to an organic electroluminescent device, and more particularly, to an organic electroluminescent display and a fabrication method thereof.

Organic electroluminescent devices have the characteristics of thin profile and light weight, and the advantages of self luminescence, high luminescent efficiency and low driving voltage. In accordance with organic luminescent materials, organic electro-luminescent display devices can be molecule-based devices or a polymer-based devices. The molecule-based device, called an organic light emitting display (OLED), uses dyes or pigments to form an organic luminescent thin film. The polymer-based device, called a polymer light emitting display (PLED), uses conjugated polymers to form an organic luminescent thin film.

Typically, a conventional organic electroluminescent device, for example an OLED, includes a glass substrate with an anode layer, a hole-injecting layer, a hole-transporting layer, an organic luminescent material layer, an electron-transporting layer, an electron-injecting layer and a cathode layer sequentially formed on the glass substrate. The hole-injecting layer, the hole-transporting layer and the organic luminescent material layer are generally referred to a luminescent layer. Typically, the anode layer is formed of indium tin oxide ($In_2O_3$:Sn, ITO) which has the advantages of facile etching, low film-formation temperature and low resistance. When a bias voltage is applied to the OLED, an electron and a hole passing through the electron-transporting layer and the hole-transporting layer respectively enter the organic luminescent material layer to combine as an exciton and then release energy to return to ground state. Particularly, depending on the nature of the organic luminescent material, the released energy presents different colors of light including red light (R), green light (G) and blue light (B). Normally, the light is emitted from one end of the substrate adjacent to the anode layer.

Normally, the cathode layer employs highly reflective material to increase luminescent brightness. The reflection of ambient light passing through the anode layer and entering the OLED by the cathode layer is, however, also increased. Thus, intensity of the reflected lights may be greater than that emitted by the OLED when operating either indoor or outdoor under bright conditions. Thus, image contrast of the OLED suffers and images cannot be clearly presented.

SUMMARY

Organic electroluminescent devices and fabrication methods thereof are provided. Display devices using the same are also provided. An exemplary embodiment of an organic electroluminescent device comprises an anode. An organic luminescent layer is formed over the anode. A partially light-transmitting layer is formed over the organic luminescent layer. A protection layer is formed over the partially light-transmitting layer. A reflection-reducing layer is formed over the protection layer. A cathode is formed over the reflection-reducing layer.

An exemplary embodiment of a display device comprises a display panel using the described organic electroluminescent device and a control unit electrically coupled to the organic electroluminescent device.

An exemplary embodiment of a method for fabricating an organic electroluminescent device comprises providing a substrate. An anode is formed over a portion of the substrate. An organic luminescent layer is formed over the anode. A partially light-transmitting layer is formed over the organic luminescent layer. A protection layer is formed over the partially light-transmitting layer. A reflection-reducing layer is formed over the protective layer. A cathode is formed over the reflection-reducing layer, whereby the protection layer prevents the partially light-transmitting layer from oxidation during formation of the reflection-reducing layer.

A detailed description is given in the following embodiments with reference to the accompanying drawings.

BRIEF DESCRIPTION OF THE DRAWINGS

The invention can be more fully understood by reading the subsequent detailed description and examples with reference made to the accompanying drawings, wherein.

DESCRIPTION

Organic electroluminescent devices and fabrication methods thereof will now described in greater detail. Some embodiments described, can potentially prevent oxidation of a partially light-transmitting layer and/or a reflection-reducing layer of an organic electroluminescent device and reduce reflection of ambient light by a cathode of the organic electroluminescent device. In some embodiments, this can be accomplished by forming a protection layer over the partially light-transmitting layer and/or a reflection-reducing layer.

Figure 1:
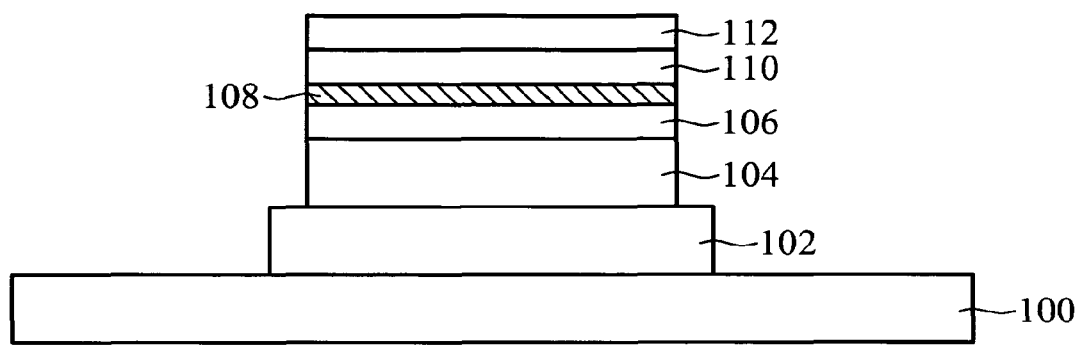
FIGS. 1-2 illustrate various embodiments of the invention, respectively showing cross sections of an organic electroluminescent device.
Figure 2:
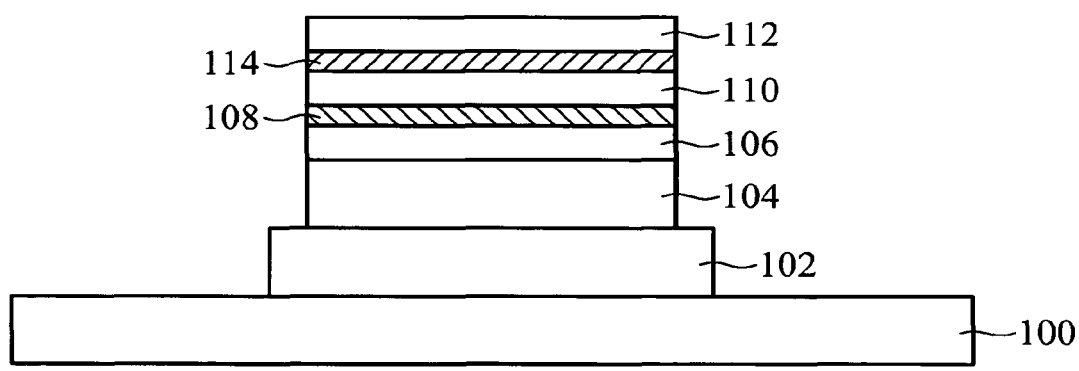

Referring now to the drawings, FIGS. 1-2 are schematic diagrams of organic electroluminescent devices. As shown in FIG. 1, the organic electroluminescent device may include an anode layer 102, luminescent layer 104, a partially light-transmitting layer 106, a protection layer 108, a reflection-reducing layer 110 and a cathode layer 112 sequentially formed over a substrate 100. The substrate 100 can be, for example, a transparent glass substrate formed with active devices (not shown) such as thin film transistors (TFTs) or other conductive lines thereon and is illustrated merely as a planar substrate here. In FIG. 1, the luminescent layer 104 is illustrated merely as a single layer but those skilled in the art will understand that the luminescent layer 104 is composed of different layers such as a hole-injecting layer, hole-transporting layer, organic luminescent material layer, electron-transporting layer, and an electron-injecting layer. The luminescent layer 104 may comprise organic materials of lower molecular weight when applied in OLED devices or organic materials of larger molecular weight when applying to PLED devices. Moreover, an optional protection layer 114 can be further formed between the cathode layer 112 and the reflection-reducing layer 110, as illustrated in FIG. 2.

Normally, the anode layer 102 is formed of indium tin oxide ($In_2O_3$:Sn, ITO) which has the advantages of facile etching, low film-formation temperature and low resistance. Moreover, the partially light-transmitting layer 106 can be a thin metal layer such as aluminum formed with a thickness of about 50-150 Å. The partially light-transmitting layer 106 has a transmittance of about 70-90% and the light intensity incident to the cathode layer 112 can thus be properly reduced. In addition, the protection layers 108 and 114 can be formed by, for example, organic materials such as copper phthalocyanine (CuPc) with a thickness of about 50-1000 Å. The reflection-reducing layer 110 can be formed by n-type doped semiconductor materials, zinc oxide (ZnO), zinc sulfide (ZnS), calcium hexaboride ($CaB_6$), or lanthanum nitride (LaN) with a thickness of about 100-3000 Å.

Compared to the conventional OLED device, when ambient light passes through the composite film including the partially light-transmitting layer 106, the protection layer 108, the reflection-reducing layer 110 and the optional protection layer 112 of the organic electroluminescent device illustrated in FIGS. 1 and 2, light intensity of the ambient lights is first reduced by the partially light-transmitting layer 106 and reflection of the ambient lights by the cathode layer 112 is then reduced by optical interference such as the destructive inference. Therefore, image contrast of an image formed by above organic electroluminescent devices is enhanced.

The above composite film is electrically conductive and substantially black in color. Additionally, the protection layer 108 formed between the partially light-transmitting layer 106 and the reflection-reducing layer 110 prevents the partially light-transmitting layer 106 from oxidation during the formation of the reflection-reducing layer 110. The optional protection layer 114 formed between the reflection-reducing layer 110 and the cathode layer 112 can prevent the reflection-reducing layer 110 from oxidation during the formation of the cathode layer 112. Therefore, reflection-reducing performance and reliability of the device are ensured. Thus, the described organic electroluminescent devices provide longer life than conventional organic electroluminescent display elements.

Figure 3:
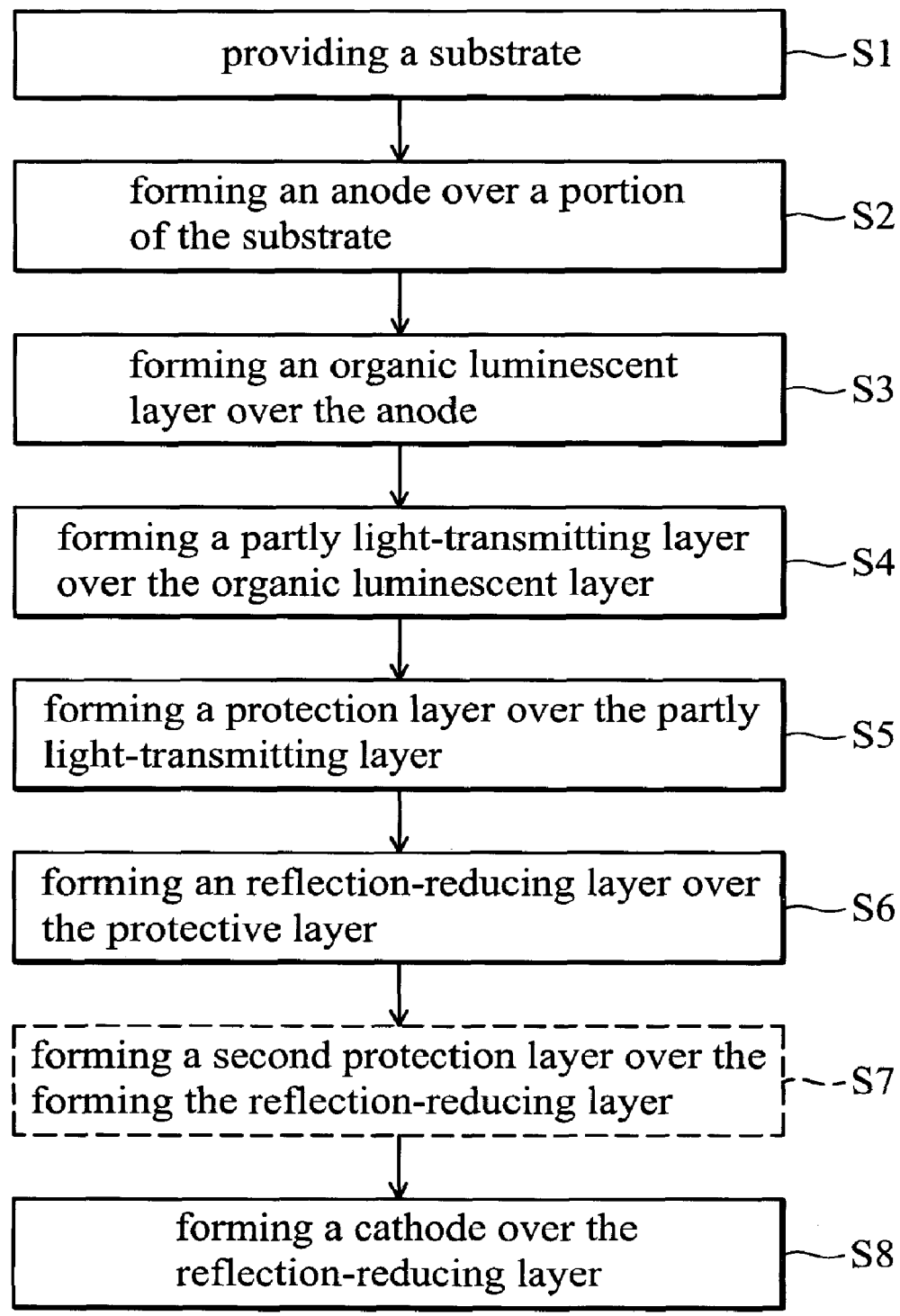
FIG. 3 is a flow chart showing fabrication of an organic electroluminescent device the invention.

Fabrication of the organic electroluminescent devices shown in FIGS. 1 and 2 are described in detail by the flow chart of FIG. 3. In step S1, a substrate, for example the substrate 100 in FIGS. 1-2 which may formed with active devices (not shown) such as thin film transistors (TFTs) and other conductive lines, is first provided. Next, in step S2, an anode layer is formed on portions of the substrate by, for example, physical vapor deposition methods such as an evaporation process for forming a layer of anode conductive material such as indium tin oxide (ITO) which are then patterned by a sequential photolithography and etching. Next, through evaporation and/or sputtering and relative mask shielding, a luminescent layer, a partially light-transmitting layer, a protective layer and a reflection-reducing layer are sequentially formed over the anode layer, as shown in steps S3-S6. Optionally, as shown in step S7, another protection layer is formed over the reflection-reducing layer by, for example, sputtering. Finally, a cathode layer of material such as aluminum is formed over the reflection-reducing layer or the optional protection layer and fabrication of the organic electroluminescent device is completed.

The fabrication method of FIG. 3 shows the protection layer formed between the partially light-transmitting layer and the reflection-reducing layer, and the protection layer optionally formed between the reflection-reducing layer and the cathode layer prevent the partially light-transmitting layer and/or the reflection-reducing layer from oxidation during the formation of the reflection-reducing layer and/or the cathode layer and ensures reflection-reducing performance and reliability of the display element. Therefore, the organic electroluminescent device formed by the described fabrication method provides better reliability and longer life than conventional organic electroluminescent device.

Figure 4:
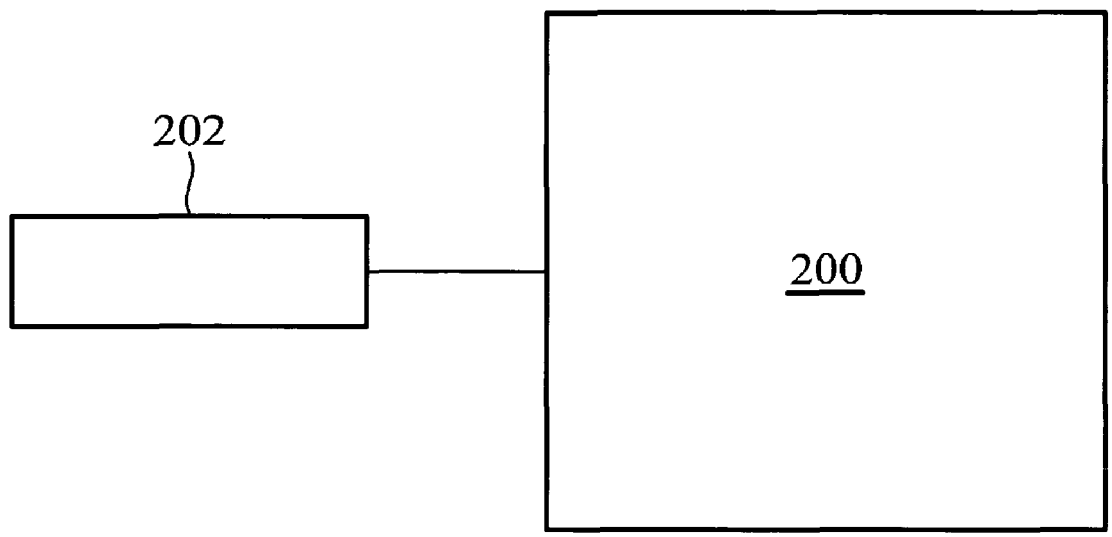
FIG. 4 is a schematic diagram of a display device according to an embodiment of the invention, incorporating the organic electroluminescent device shown in FIGS. 1-2 and a control unit.

FIG. 4 is a schematic diagram showing a display panel 200 incorporating at least one organic electroluminescent device of FIGS. 1-2. The display panel 200 and the organic electroluminescent device thereon are electrically coupled to a control unit 202 shown in FIG. 4 to thereby form a display device 204 and an image can be formed thereon according to an input signal (not shown). The display panel 200 further comprises a panel (not shown) opposite to the substrate 100 having the organic electroluminescent devices. The control unit 202 can comprise source and gate driving circuits (not shown) for controlling the display device 204 and for operating display panel 204. Since the display panel 200 using the described electroluminescent devices have enhanced contrast and use of an additional polarizer sheet for improving image contrast can be eliminated. Thus, production costs and fabrication time can be further reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an organic electroluminescent device, comprising:
   providing a substrate;
   forming an anode over a portion of the substrate;
   forming an organic luminescent layer over the anode;
   forming a partially light-transmitting layer over the organic luminescent layer;
   forming a first protection layer over the partially light-transmitting layer, wherein the first protection layer comprises copper phthalocyanine;
   forming a reflection-reducing layer over the first protective layer;
   forming a second protection layer over the reflection-reducing layer; and
   forming a cathode over the second protection layer, whereby the first protection layer prevents the partially light-transmitting layer from oxidation during formation of the reflection-reducing layer, and the second protection layer prevents the reflection-reducing layer from oxidation during formation of the cathode.

2. The method as claimed in claim 1, wherein the first protection layer is formed by an evaporation process.

3. The method as claimed in claim 1, wherein the second protection layer is formed by an evaporation process.

4. The method as claimed in claim 1, wherein the partially light-transmitting layer is formed by a sputtering process.

5. The method as claimed in claim 1, wherein the reflection-reducing layer is formed by a sputtering process.

6. The method as claimed in claim 1, wherein the second protection layer comprises copper phthalocyanine.

7. The method as claimed in claim 1, wherein the first protection layer has a thickness of about 50-1000 Å.

8. The method as claimed in claim 6, wherein the second protection layer has a thickness of about 50-1000 Å.

9. The method as claimed in claim 1, wherein the partially light-transmitting layer has a thickness of about 50-150 Å.

10. The method as claimed in claim 1, wherein the reflection-reducing layer has a thickness of about 100-3000 Å.

* * * * *